US007605914B2

(12) United States Patent
Stammler et al.

(10) Patent No.: US 7,605,914 B2
(45) Date of Patent: Oct. 20, 2009

(54) OPTICAL SYSTEM AND METHOD FOR IMPROVING IMAGING PROPERTIES THEREOF

(75) Inventors: Thomas Stammler, Aalen (DE); Christian Wagner, KS Eersel (NL); Gerd Reisinger, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/348,204

(22) Filed: Jan. 2, 2009

(65) Prior Publication Data

US 2009/0225308 A1  Sep. 10, 2009

Related U.S. Application Data

(63) Continuation-in-part of application No. 11/238,841, filed on Sep. 29, 2005, now abandoned.

(51) Int. Cl.
*G01N 21/00* (2006.01)

(52) U.S. Cl. .................................. 356/239.2

(58) Field of Classification Search ........................ None
See application file for complete search history.

(56) References Cited

U.S. PATENT DOCUMENTS

| | | |
|---|---|---|
| 3,785,713 A | 1/1974 | Walles |
| 4,208,101 A | 6/1980 | Trapp et al. |
| 4,629,313 A | 12/1986 | Tanimoto |
| 4,668,077 A | 5/1987 | Tanaka |
| 4,953,962 A | 9/1990 | Esswein et al. |
| 4,976,525 A | 12/1990 | Matsumura et al. |
| 5,111,325 A | 5/1992 | DeJager |
| 5,212,597 A | 5/1993 | Yamada |

(Continued)

FOREIGN PATENT DOCUMENTS

DE    195 16 017    9/1996

(Continued)

OTHER PUBLICATIONS

Determiniation if High-Order Lens Aberration Using Phase-Amplitude Linear Alegebra, Hiroshi Fukuda, 1999 American Vacuum Society (SO734-211X(99)05006-4).

(Continued)

*Primary Examiner*—Michael A Lyons
*Assistant Examiner*—Juan D Valentin
(74) *Attorney, Agent, or Firm*—Factor & Lake, Ltd.

(57) ABSTRACT

An optical system has at least two optical elements whose spatial relation with respect to each other can be changed. At least one of the optical elements comprises a plurality of optical components. The optical system comprises first measuring means for individually measuring an image defect of each optical component, and first computing means for computing first target positions for the plurality of optical components such that an overall image defect of the at least one of the optical elements is below a predetermined threshold value. Second measuring means are provided for measuring an overall image defect of the optical system, and second computing means represent the measured overall image defect as a linear combination of base functions of an orthogonal function set. The second computing means calculate second target position for the at least two optical elements so as to reduce the overall image defect.

41 Claims, 11 Drawing Sheets

U.S. PATENT DOCUMENTS

| | | | |
|---|---|---|---|
| 5,339,193 | A | 8/1994 | Korpert et al. |
| 5,384,573 | A | 1/1995 | Turpin |
| 5,561,562 | A | 10/1996 | Bender |
| 5,835,280 | A | 11/1998 | Griffith |
| 5,847,822 | A | 12/1998 | Sugiura et al. |
| 5,852,518 | A | 12/1998 | Hatasawa et al. |
| 5,995,292 | A | 11/1999 | McDonald |
| 6,522,392 | B1 | 2/2003 | Muller-Rissmann et al. |
| 6,678,240 | B2 | 1/2004 | Geh et al. |
| 2001/0006412 | A1 | 7/2001 | Karl-Heinz et al. |
| 2007/0071303 | A1 | 3/2007 | Stammler et al. |

FOREIGN PATENT DOCUMENTS

| | | |
|---|---|---|
| EP | 0 992 853 A3 | 4/2000 |
| EP | 1 128 217 A2 | 8/2001 |
| EP | 1 128 218 A2 | 8/2001 |
| JP | 1 0154 657 | 6/1998 |
| JP | 2000 121491 | 4/2000 |

OTHER PUBLICATIONS

European Search Report for Application 02019258.9-1226, Carl Zeiss Semiconductor Manufacturing Technologies AG.

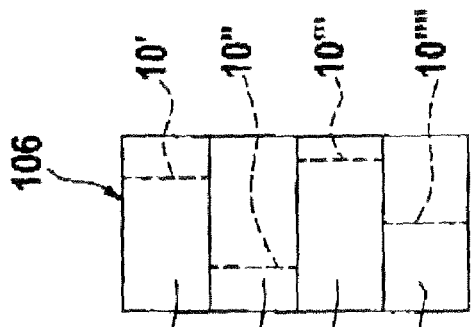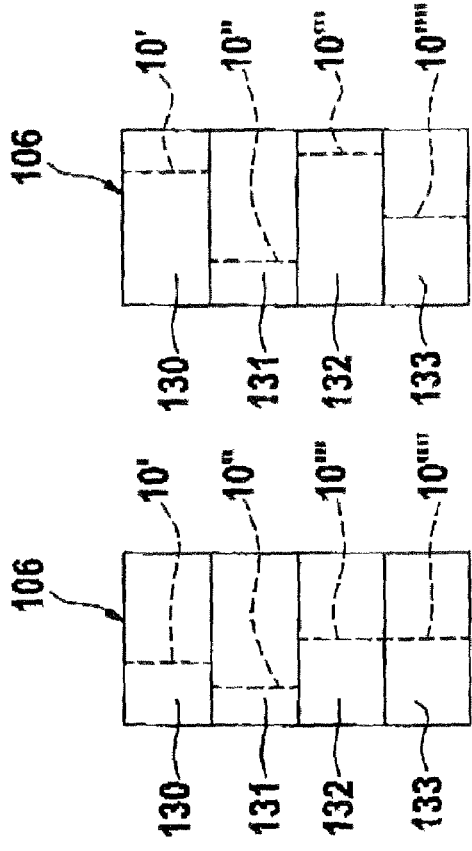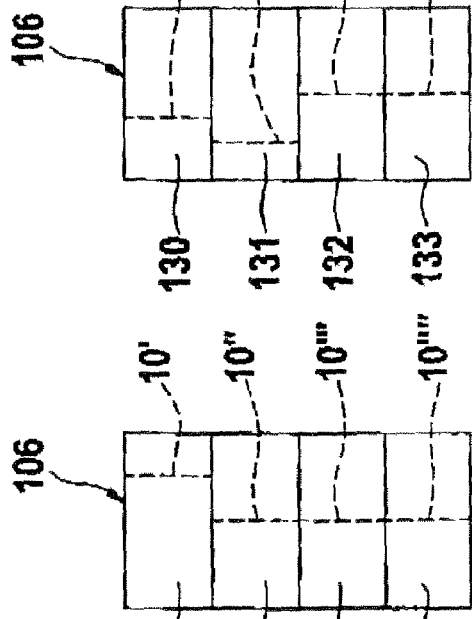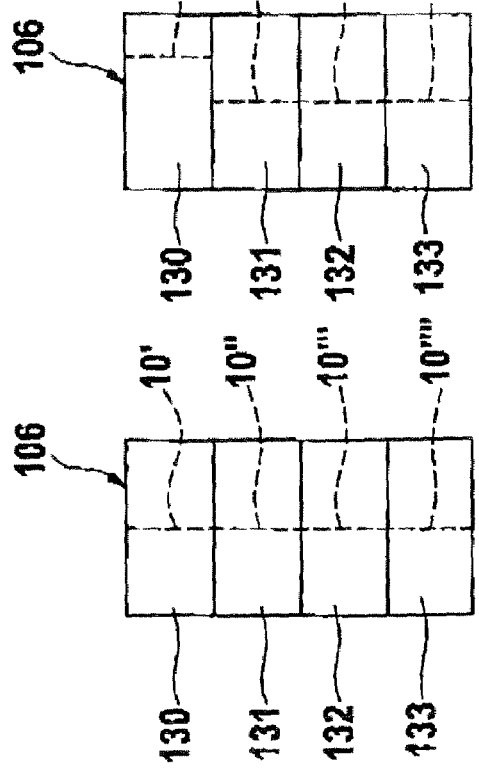

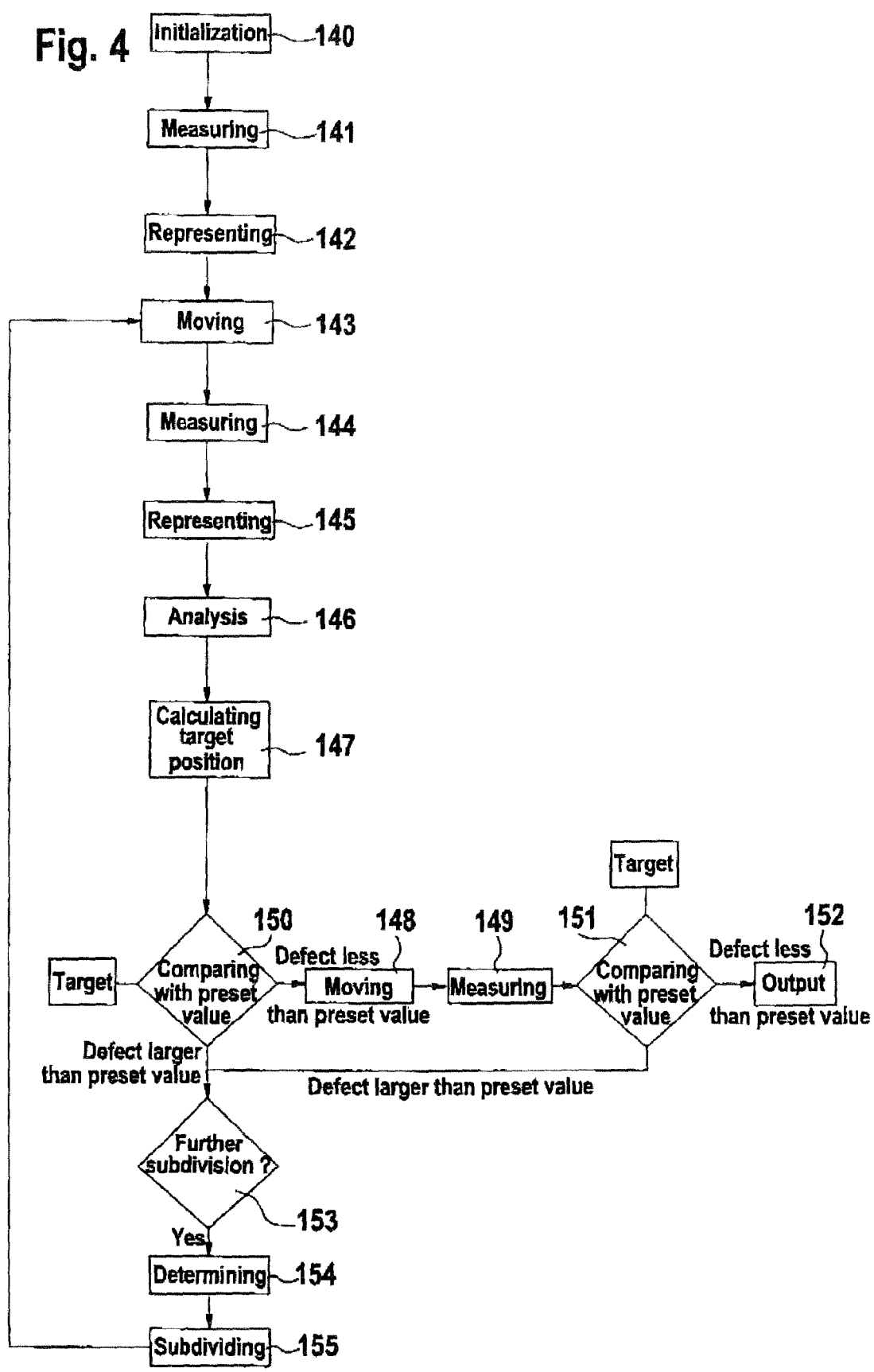

US 7,605,914 B2

OPTICAL SYSTEM AND METHOD FOR IMPROVING IMAGING PROPERTIES THEREOF

RELATED APPLICATIONS

This application is a continuation-in-part of U.S. patent application Ser. No. 11/238,841, filed Sep. 29, 2005; and is related to U.S. Pat. No. 6,678,240, issued Jan. 13, 2004 the contents of all of these documents are incorporated herein by reference.

BACKGROUND OF THE INVENTION

1. Field of the Invention

The present invention relates to an optical system, in particular to a projection objective of a microlithographic projection exposure apparatus, and a method for improving imaging properties of such an optical system.

2. Description of Related Art

Optical assemblies comprising at least one movable optical element are known on the market, and include projection objectives for microlithographic projection exposure apparatus. With these and other sophisticated optical systems a high image quality is required in order to produce a picture of a structure that is as free of image defects as possible. The movability of at least one optical element within such a projection objective lens system serves to vary the imaging properties of the projection objective lens system with the aim of reducing occurring image defects.

The choice of the position to which a moveable optical element should be adjusted for reducing image defects has hitherto often been made by individual measurement of the imaging properties of the optical elements before they are assembled. Since many image defects are produced only during assembly, for example as a result of stress induced by lens mounts, such an approach has proven to be too inaccurate.

There are other approaches in which the positioning of the optical elements is improved on the basis of readily visualisable target quantities that reproduce, although only incompletely, the image quality and that have been obtained from the interaction of the optical elements. These approaches rely on the experience of the technician entrusted with the adjustment of the assembly to find the most favorable rotational position. Such optimization methods are insufficiently deterministic.

A method that necessarily leads to a very good or even optimum relative position between the optical elements takes measurements of the image defects of the optical assemblies, including both moveable and stationary optical elements, at all possible positions of the movable optical element. This procedure is too tedious and complicated since the number of possible positions is very large, and therefore measurements are extremely time consuming.

In the attempt to improve projection objectives in order to satisfy increasingly stringent requirements as regards image quality, projection objectives have been proposed in which movable optical components can be arranged at various positions within the projection objective system. In this connection the number of movable optical components is not limited to one; instead there may often be several movable optical elements within the projection objective lens system.

With such projection objectives the question arises at which position should a movable optical element be provided within the projection objective in order to be able to correct a specific image defect, and how many optical elements may optionally have to be moved for this purpose. In addition there is the question, what degree of freedom of movement can be employed in order to correct a specific image defect. Such degrees of freedom of movement include the rotation of optical elements within the projection objective lens system, the displacement of optical elements along the optical axis of the projection objective lens system (focusing) and vertical thereto (centering), and the tilting of optical elements within the projection objective lens system.

Thus there exists a plurality of degrees of freedom that are in principle available for correcting image defects within a projection objective lens system.

With the previously known optical systems a choice of the degrees of freedom that were employed for correcting image defects was made on the basis of trial-and-error methods. In the same way as when finding the most favorable rotational position, here too the experience of the respective technician was decisive in finding useful degrees of freedom, which however led to adjustment results that were not deterministically reproducible. Often the choice of the lenses to be moved as well as the choice of the degrees of freedom of movement were very time-consuming and also did not always achieve given specifications.

Sometimes it is in principle known which lenses within a projection objective lens system have to be moved in order to correct specific image defects. But also in these cases a multidimensional problem exists if several lenses within a projection objective lens system can be moved. As a result an optimal position configuration of all movable lenses in which the overall image defect usually falls below given specifications, or an absolute minimum cannot be found with reasonable effort and expenditure.

U.S. Pat. No. 6,934,011 B2, which is a continuation of U.S. Pat. No. 6,678,240 B2, discloses a method for optimizing the imaging properties that successfully overcomes the above-mentioned problems. According to this known method, the overall image defect of an optical system comprising at least two optical elements is measured and represented as a linear combination of base functions of an orthogonal function set. Then the spatial relation of the at least two optical elements is changed. The overall image defect is measured again in this new spatial relation and represented as a new linear combination of base functions. From these representations the image defect of each of the at least two optical elements is calculated. This makes it possible to determine a target position of the at least two optical elements in which the overall image defect is minimized.

The present invention is based on this known method, but seeks to further improve the results that may be obtained with this known method. For example, it is difficult with this known method to correct image defects having a higher azimutal order. Such image defects may be caused by lenses or other optical components having significant inhomogeneities of the refractive index and/or non-rotationally symmetric surface defects.

SUMMARY OF THE INVENTION

It is therefore an object of the present invention to further improve the method disclosed in U.S. Pat. No. 6,934,011 B2.

It is a further object to improve the known method such that it is possible to use optical components causing significant image defects of a higher azimutal order.

According to a first aspect of the invention, this object is achieved by carrying out a pre-optimization for optical elements that include several optical components such as lenses or mirrors. The pre-optimization includes the measuring of the individual optical components in order to determine the image defect caused by each optical component. The overall image defect of the optical element comprising the measured optical components is represented as a linear combination of base functions of an orthogonal function set. Then first target positions for the plurality of optical components are computed such that the overall image defect of the respective optical element is below a predetermined threshold value. The pre-optimization process is now terminated for the respective optical element, and it may be repeated for another optical element of the optical system.

After pre-optimizing one, several or all optical elements of the optical system, the optimization process continues with optimizing the spatial relation of the optical elements, as is known as such from U.S. Pat. No. 6,934,011 B2. The pre-optimization may be carried out as a closed process such that all optical elements are independently pre-optimized before the next optimization level commences that optimizes the spatial relation of the optical elements.

The new approach makes it possible to effectively correct image defects which are not substantially affected by the assembly of the optical elements into the entire optical system. Other image defects, which result from the assembly of the entire optical system, for example image defects induced by mechanical stress exerted by mounts of optical components or caused by manufacturing tolerances, can be corrected by the subsequent optimization method involving the in situ measuring of image defects of movable parts.

Another advantage of the new approach is the ability to employ optical components in the manufacture of the optical system that individually would not meet the tight specifications that prevail in sophisticated optical systems, e.g. projection objectives used in microlithographic exposure apparatus. In a conventional approach, manufacturing tolerances, for example tolerances relating to the surface shape of the optical component, are calculated for each optical component on the basis of the overall specification of the optical system. An optical component that does not meet the specification calculated specifically for this component is usually discarded. According to the new approach, however, there is a substantial probability that such an optical component may nevertheless be used in the assembly of the optical system. This is due to the fact that optical defects caused by the inferior optical component may be substantially corrected for by the other optical components of the optical element if these are assembled in their optimum target positions calculated in the pre-optimization process. This decreases the number of discarded optical components and therefore substantially reduces the manufacturing costs of the optical system.

In an advantageous embodiment the manufacture of the optical components is not finished before they are measured during the pre-optimization process. If it is discovered that an optical component has to be discarded because otherwise the overall image detect of the optical element exceeds a predetermined threshold value, this is cheaper than discarding an optical component that is ready for being installed in the optical system. For example, if the optical components are lenses made of lens blanks, it is advantageous to individually measure a deviation from a specification relating, e.g., to the inhomogeneity of the refractive index or the birefringence tensor, of one or more lens blanks instead of measuring this quantity of the grinded, polished and coated lenses. Substantial cost savings are achieved if a lens blank has to be discarded instead of a grinded, polished and coated lens.

According to a second aspect of the invention, the optical system comprises a correcting optical element for correcting an image defect. The correcting optical element has at least two distinct configurations. Computing means are provided for representing the optical effect of the correcting optical element in the at least two distinct configurations as linear combinations of base functions of an orthogonal function set. When calculating a target position for the at least two optical elements, the effect of the correcting optical elements is integrally considered as a free parameter, and thus an optimum configuration of the correcting optical element is determined so as to further reduce the overall image defect.

Considering the different configurations of the correcting optical element as additional degrees of freedom in a single optimization process yields, at least in general, better results as may be obtained in an approach in which the target position of the optical elements is determined beforehand, and residual image defects are corrected by selecting a suitable configuration of the correcting optical element.

The correcting optical element of the present invention may be configured such that it is possible to correct image defects that are non-rotationally symmetric. Therefore it is possible to use optical components that introduce substantial non-rotationally symmetric image defects, and to correct these defects using the correcting optical element. According to conventional approaches, such optical components often have to be discarded.

The correcting optical element may comprise a (reversibly) deformable optical component, for example a lens, and an actuator for deforming the component. Alternatively or additionally, the correcting optical element may be formed by an optical component having an optical surface that is irreversibly deformed, in particular by locally removing or adding material at its optical surface so as to achieve a locally aspherized surface. In this case the different configurations are only present as a computational concept, and the real correcting optical element assembled into the optical system is manufactured according to the computationally selected configuration.

Generally, the optical effect of the correcting optical element in the at least two distinct configurations may be measured. This may be particularly advantageous, for example, in the case of deformable optical elements that are non-rotationally bent with the help of actuators. If the correcting optical element has a locally aspherized optical surface, particularly as a result of locally removing material from its optical surface, it may be more appropriate to simulate the optical effect using its representation as linear combination of base functions.

It is to be understood that the present invention may be incorporated into any of the advantageous embodiments disclosed in U.S. Pat. No. 6,934,011 B2 whose full disclosure is incorporated herein by reference.

BRIEF DESCRIPTION OF THE DRAWINGS

Various features and advantages of the present invention may be more readily understood with reference to the following detailed description taken in conjunction with the accompanying drawing in which:

FIG. 3 is a side view of four diagrammatically represented relative positions of optical elements of an alternative projection objective lens system;

FIG. 4 is a flow diagram for the optimization of the projection objective lens system of FIG. 3;

DESCRIPTION OF PREFERRED EMBODIMENTS

Figure 1:
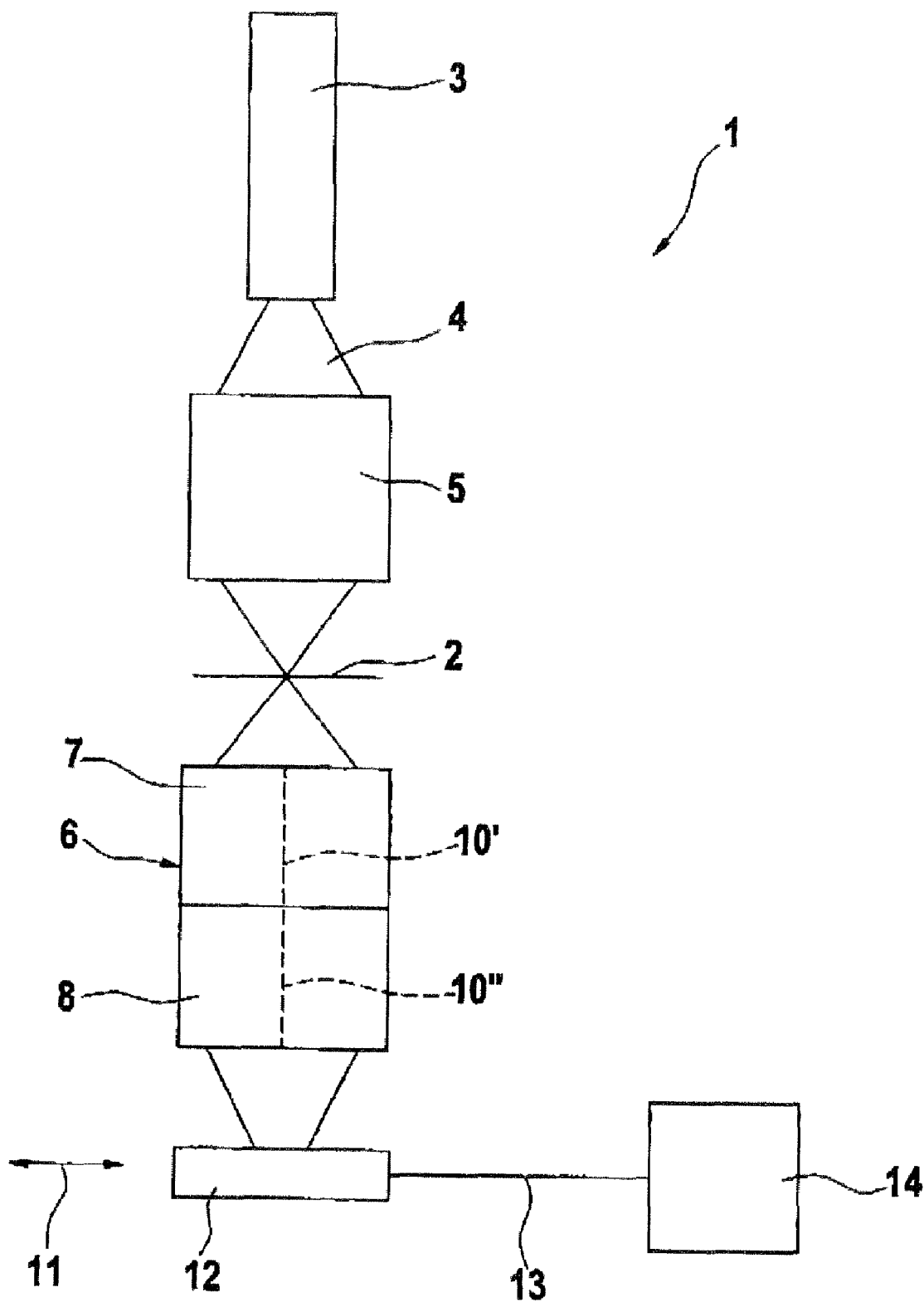
FIG. 1 is a diagrammatic side view of a projection illumination system for microlithography using a projection objective lens system that can be optimized according to the invention.

While this invention is susceptible of embodiment in many different forms, there is shown in the drawings and will be described in detail, one specific embodiment with the understanding that the present disclosure is to be considered as an exemplification of the principles of the invention and is not intended to limit the invention to the embodiment illustrated.

A projection illumination system diagrammatically illustrated in FIG. 1 and denoted overall by the reference numeral 1 serves for the transfer of structures contained on a mask 2 to a water (not shown).

The projection illumination system 1 comprises as light source a UV laser 3, for example an ArF laser or a F2 laser. Projection light 4 emitted by the laser 3 passes through an illumination optics system 5 and illuminates the mask 2. An image of the thereby illuminated structures on the mask 2 is formed on the wafer by a projection objective lens system 6.

The projection objective lens system 6 has two optical elements 7, 8 moveable relative to one another. The relative movement is effected by rotation of the upper optical element 7 in FIG. 1 about the optical axis of the projection objective lens system 6. The optical elements 7, 8 shown diagrammatically in FIG. 1 may comprise groups of optical components, for example lenses, or also individual optical components.

In the drawing the optical elements that can be rotated relative to one another, for example the optical elements 7, 8 of the projection objective lens system 6 in FIG. 1 are provided with a circumferential marking 10 (shown by the dotted line) running parallel to the optical axis, illustrating an instantaneous rotational position of the respective optical element.

The rotation of the optical element 7 is effected by loosening the securement of the optical element 7 within the projection objective lens system 6 and manually rotating the element. The optical element 7 is then secured once more in the projection objective lens system 6.

In the diagrammatic representation of FIG. 1 the optical element 8 denotes all optical elements that contribute to the image defect of the projection objective lens system 6 and that are stationary, i.e. do not move during a rotation of the optical element 7.

In the region of the image plane of the projection objective lens system 6 an air image measuring device 12 is provided that can be displaced perpendicularly to the optical axis of the lens system (see double arrow 11). This measures the intensity of the projection light 4 in the region of the image plane of the projection objective lens system 6. The intensity measurement may, as illustrated in FIG. 1, be carried out directly in the region of the image plane or via an intermediate image of the image plane.

The air image measuring device 12 communicates via a data line 13 with a computer 14. The air image measuring device 12 and the computer 14 together form an optimization device for optimizing the imaging properties of the projection objective lens system 6. This may be a fixed component of the projection illumination system 1. Alternatively it is possible for the whole optimization device or parts thereof to be connected as required to the projection objective lens system during the projection operation of the projection illumination system 1, but separately from the latter.

A method for optimizing the imaging properties of the projection objective lens system 6 is described hereinafter with the aid of the flow diagram of FIG. 2.

Starting from a first position of the projection objective lens system 6, in which as in FIG. 1 the circumferential markings 10 of the optical elements 7, 8 coincide with one another and are hereinafter identified as the initial position 18, the wave front of the projection light 4 is measured in a measurement step 19 with the aid of the air image measuring device 12. This is a direct measure of the overall image defect of the projection objective lens system 6, consisting of the image defects of the optical elements 7, 8.

The measurement data recorded by the air image measuring device 12 are transmitted via the data line 13 to the computer 14 (see FIG. 1).

In a following calculation step 20 the measured overall image defect is represented as a linear combination of the base functions of an orthogonal function set. The scalar and vector Zernike functions Z serve as orthogonal function set, depending on the field co-ordinates in the plane in which the measurement is performed by the air image measuring device 12.

The factorization of the scalar image defect component V of the overall image defect into scalar Zernike functions is given hereinafter by way of example:

$$V(r, \Phi) = \sum_{i=1}^{n} b^{(i)} Z^{(i)}(r, \Phi). \quad (1)$$

In the above, $Z^{(i)}$ are the various scalar Zernike functions and $b^{(i)}$ are the associated coefficients that are necessary for the correct description of the measured scalar image defect V. The coefficients $b^{(i)}$ are determined with the aid of conventional mathematical variation methods so as to provide as good a match as possible of the linear combination of the Zernike functions to the measurement data of the overall image defect. The coefficients $b^{(i)}$ obtained may be expressed as the coefficient spectrum S. The found coefficient spectrum S in the initial position 18 is hereinafter identified as $S_0$.

In principle all types of image defects that are superimposed to form the overall image defect can be described by such a linear combination as long as only sufficiently high orders i of the scalar and vector Zernike functions are included in the linear combinations. Examples of such types of image defects include image shell, which can be described by scalar fields, as well as astigmatism, coma and distortion, which can be described by vector fields.

The procedural steps that have just been described (measurement step 19, calculation step 20) are carried out in a similar manner as measurement step 21 and calculation step 22 in a new position 23 of the optical elements 7, 8 of the projection objective lens system 6. The new position 23 is likewise illustrated diagrammatically in FIG. 2. Here the optical element 7 is, compared to the optical element 8, rotated by an angle of rotation α1 so that the circumferential marking 10' is shifted to the right in FIG. 2 compared to the aligned position in the initial position 18.

Figure 2:
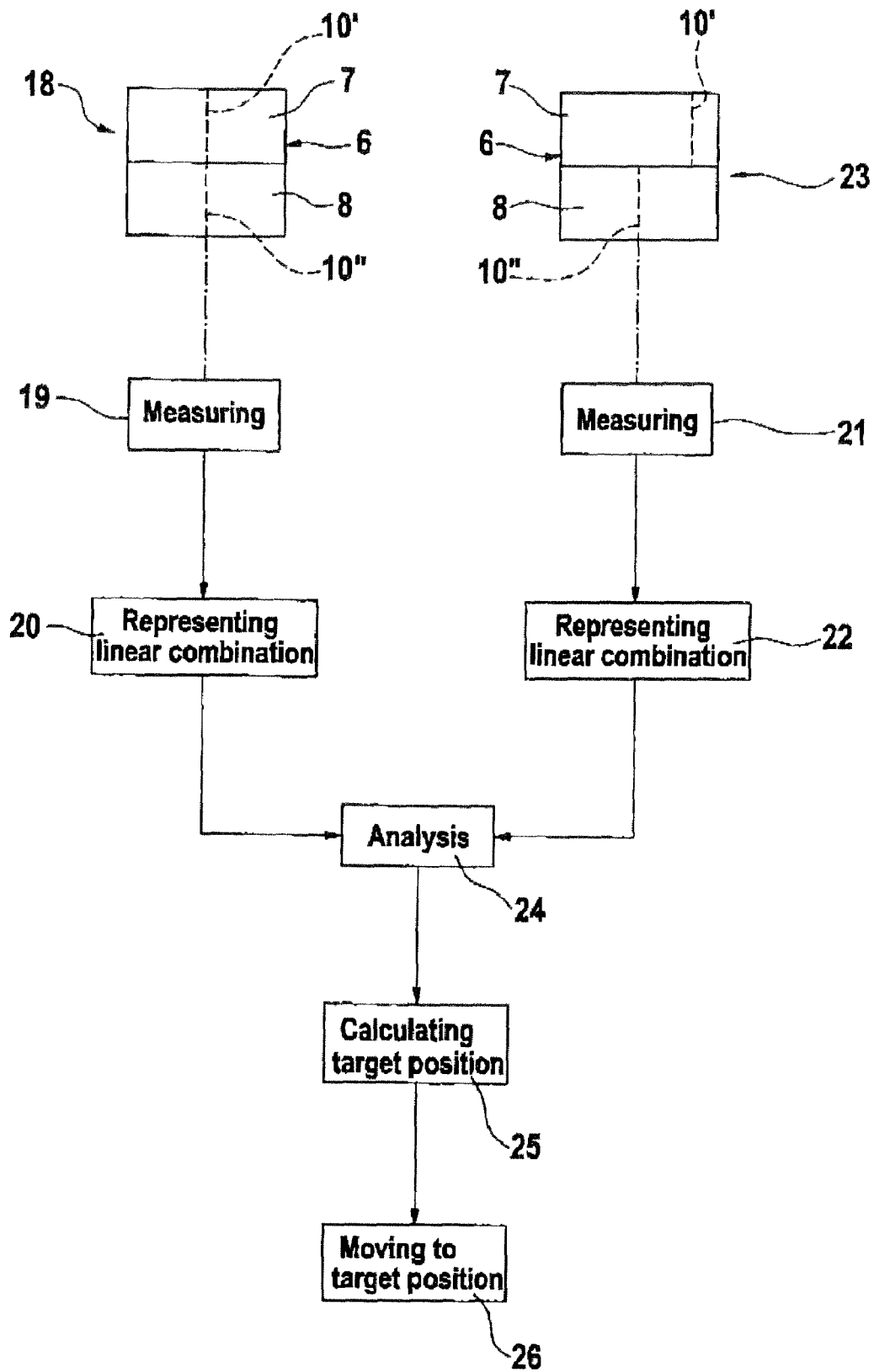
FIG. 2 is a flow diagram for the optimization of the projection objective lens system of FIG. 1.

The allocation of the positions 18 and 23 of the projection objective lens system 6 to the procedural steps 19, 20 and 21, 22 is illustrated in FIG. 2 by chain-dotted lines.

For the new position 23 the result of the calculation step 22 is a coefficient spectrum $S_1$ that represents the linear combination of the Zernike functions for describing the overall image defect in the new position 23.

If after the calculation step 22 the linear combinations of the Zernike functions are available for describing the overall image defects of the projection objective lens system 6 in the initial position 18 and the new position 23, the calculation of the individual image defects of the optical elements 7 and 8 is carried out in an analysis step 24.

For this it is assumed that, on account of the orthogonality of the Zernike functions, the following relationships can be adopted:

$$S_0 = S_{OE1} + S_{OE2}. \quad (2)$$

and also $$S_1 = T(\alpha_1) \cdot S_{OE1} + S_{OE2}. \quad (3)$$

In equation (3) $S_{OE1}$ and $S_{OE2}$ denote the coefficient spectra that describe the individual image defects of the optical elements 7 (element one, E1) and 8 (element two, E2). $T(\alpha_1)$ denotes the rotation matrix that, on account of the rotation of the optical element 7 about the angle of rotation $\alpha_1$, has to be used on its coefficient spectrum $S_{OE1}$ in order to describe in the stationary spatial co-ordinates the coefficient spectrum of the rotated optical element 7.

The coefficient spectra of the optical elements 7 and 8 can be calculated directly from the last two equations given above:

$$S_{OE1} = [T(\alpha_1) - E]^{-1} \cdot (S_1 - S_0) \quad (4)$$

$$S_{OE2} = S_0 - S_{OE1}. \quad (5)$$

Here, E denotes the unit matrix. The image defects of the individual optical elements 7, 8 are obtained by inserting the calculated coefficient spectra in the linear combination of the Zernike functions.

A target position of the optical element 7, in which the overall image defect of the projection objective lens system 6 is optimized, is calculated in a calculation step 25 following the analysis step 24.

In this connection, the overall coefficient spectrum $$S_{overall} = T(\alpha) \cdot S_{OE1} + S_{OE2}. \quad (6)$$

for which the RMS value of the overall image defect or alternatively the maximum contribution of the overall image defect in the field are minimized, is sought as a function of the angle of rotation α of the optical element 7. A combination of the RMS value and the maximum contribution of the overall image defect are also suitable as optimization quantity.

In general, in order to determine a parameter (in this case the angle of rotation α) resulting in a coefficient spectrum with optimized overall image defect, any function can be used that contains the coefficient spectrum corresponding to this parameter and that represents the quality of the image. Such a function is hereinafter termed a merit function. The result of the merit function is as a rule a scalar quantity that is minimized for the optimization.

The overall coefficient spectrum is varied by altering the angle of rotation α by means of known mathematical methods until a target angle of rotation αZ is found resulting in the overall coefficient spectrum $S_{overall}$ with an optimized overall image defect.

The target angle of rotation αZ calculated in the computer 14 is then printed out.

In a following control and movement step 26 the optical element 7 is then manually rotated by the target angle of rotation αZ relative to the optical element 8. The overall image defect of the projection objective lens system 6 is then optimized.

Further variants of projection illumination systems and projection objective lens systems and methods for their optimization are described hereinafter. Components and procedural steps that correspond to those that have already been described above are identified by reference numerals increased in each case by 100, and are not discussed in detail any further.

An alternative projection objective lens system 106 (see FIG. 3) comprises a total of three optical elements 130, 131, 132 rotatable about their optical axis and a stationary optical element 133. The optical elements 130 to 133 carry circumferential markings 10' to 10''' similarly to the first described embodiment.

A method for optimizing the overall image defect of the projection objective lens system 106 is described hereinafter with the aid of FIG. 4:

Which part of the projection objective lens system 106 that is to be moved first is predetermined initially in an initialization step 140. The projection objective lens system 106 is for this purpose subdivided into a first part integral with the part to be moved and a second, stationary part. An individual drive device 134, 135, 136 or a combination of the latter may be predetermined for this purpose by means of a random function generated by a random generator. The subdivision specified in the initialization step 140 is converted into an output signal that enables the user in the course of the further procedure to move the optical elements 130 to 132 of the projection objective lens system 106 according to the subdivision specified in the initialization step 140.

Which part of the projection objective lens system 106 is moved first of all is not important for the further procedure, and this choice may therefore also be fixed beforehand (for example, first of all rotation of the uppermost optical element 130 in FIG. 3).

The overall image defect of all optical elements in the initial position of the projection objective lens system 106 is measured in a measurement step 141 using an air image measuring device (c.f. air image measuring device 12 of the embodiment according to FIG. 1). This measurement is carried out in the same way as has been described in connection with FIGS. 1 and 2 (measurement steps 19 and 21).

A coefficient spectrum S0 is determined in a calculation step 142 on the basis of the image defect measured in the measurement step 141. This is carried out in a similar way to that described in connection with the optimization method according to FIG. 2 (calculation steps 20 and 22).

The part predetermined in the initialization step 140 to be moved is then rotated by an angle of rotation $\alpha_1$ in a movement step 143. The optical elements 130 to 133 of the projection objective lens system 106 are then located in a new measurement position.

The overall image defect of the projection objective lens system 106 in the new measurement position is remeasured in a further measurement step 144.

The image defect determined in the measurement step 144 is also converted in a subsequent calculation step 145 into a coefficient spectrum $S_1$.

A calculation of the image defects of the moved part and of the stationary part of the projection objective lens system 106 is then performed in an analysis step 146. This takes place in a similar way as already described in connection with FIG. 2 (analysis step 24). The moved part of the projection objective lens system 106 corresponds in this connection to the optical element 7 in FIG. 2, and the stationary part of the projection objective lens system 106 corresponds to the optical element 8. Instead of the coefficient spectra $S_{OE1}$ and $S_{OE2}$ of the optical elements 7 and 8 obtained in the method according to FIG. 2, coefficient spectra SBT for the moved part as well as SST for the stationary part of the projection objective lens system 106 are obtained in the method according to FIG. 4.

In a similar way as in the calculation step 25 of the method according to FIG. 2, a target angle of rotation $\alpha Z$ by which the moved part of the projection objective lens system 106 is to be rotated is calculated by means of a merit function in a calculation step 147, thereby minimizing the image defect of the projection objective lens system 106 in accordance with the merit function. The result of the calculation step 147 is a target position of the projection objective lens system 106 as well as the overall coefficient spectrum of the calculated overall image defect in the target position. The target position at this point in time has still not actually been adjusted but exists simply as an imaginary calculation result.

Up to the initial initialization step 140, the procedural steps 141 to 147 of the optimization method according to FIG. 4 thus correspond to the procedural steps 19 to 22 as well as 24 and 25 of the optimization method according to FIG. 2. In addition, with the method according to FIG. 4 the movement step 143 that corresponds in the method according to FIG. 2 to the difference between the initial position 18 and the new measurement position 23 is also explicitly stated.

In a comparison step 150 the overall image defect calculated in the calculation step 147 is compared with a preset value (target) that has been stored in a memory.

If the comparison step 150 shows that the overall image defect is less than the preset value, a corresponding movement takes place in a movement step 148 so that the moved part of the projection objective lens system 106 is brought into the target position.

In the target position of the projection objective lens system 106 adjusted in the movement step 148, the overall image defect of the projection objective lens system 106 is remeasured using the wave front sensor. This takes place in a measurement step 149.

In a further comparison step 151 the overall image defect measured in the measurement step 149 is compared with the preset value (target). By means of this check of the measurement value it is ensured that the preset target value is in fact also maintained. Variations between the calculated and measured overall image defects may be caused for example by influencing quantities that have been taken into account only approximately or indeed not at all in the calculation of the overall image defect.

When the comparison step 151 shows that the measured overall image defect too is smaller than the preset value, the overall image defect measured in the measurement step 149 is displayed after the comparison step 151 in an output step 152. The optimization procedure is in this case complete.

If the comparison in the comparison step 150 or in the comparison step 151 shows that the overall image defect calculated in the calculation step 141 or determined in the measurement step 149 is greater than the preset value, then it is determined in a further comparison step 153 whether parts of the projection objective lens system 106 are still present that can still be subdivided into parts that have not yet been moved relative to one another. This comparison is performed by comparing the previous movement of the optical elements 130 to 132 of the projection objective lens system 106, which was initiated in the movement step 143, with the principal movement possibilities of the optical elements 130 to 132 of the projection objective lens system 106. This takes place by evaluating corresponding movement data that are input by the user into an input terminal (not shown) of the computer 14 during the course of the manual rotation of the elements 130 to 132 performed prior to this, and are used as comparison values.

The projection objective lens system 106 comprising four optical elements 130-133 movable with respect to one another can, after a first movement of a movable part with respect to a stationary part, obviously still be split up into further parts movable with respect to one another (see in this connection FIG. 3). If for example in the movement step 143 the optical element 130 alone is rotated, then a stationary part of the projection objective lens system 106 together with the optical elements 130 to 133 still exists. This part can be subdivided for example into a movable part together with the optical element 131, which is moved together with the optical elements 132, 133 relative to a stationary part.

After a movement step 143 carried out only once, several potential further possibilities of subdivision into a next part to be moved and into a next stationary part thus still exist in the projection objective lens system 106.

This result of the comparison step 153 leads therefore to a determination step 154 in which, with the aid of the previous rotational procedures, it is determined whether there are several possibilities of further subdividing the parts of the projection objective lens system 1 already rotated relative to one another into parts to be rotated relative to one another. This is the case for example if, during the first movement step 143, the optical elements 130, 131 are rotated jointly by an angle of rotation $\alpha$ relative to the optical elements 132, 133 that remain stationary. In this case a moved part of the projection objective lens system 106 is present that comprises the optical elements 130, 131 and may thus be subdivided still further, since the optical elements 130, 131 are for their part movable with respect to one another. Also, the initially stationary part together with the optical elements 132, 133 is present, which can likewise be subdivided still further since the optical element 132 can be rotated relative to the optical element 133.

In such a case involving several possibilities of further subdivision, that part that can still be subdivided, whose image defect provides the greatest contribution to the overall image defect that was determined in the measurement step 149, is determined in the determination step 154 on the basis of the result of the analysis step 146.

The subdivision determined in the determination step 154 is converted into an output signal in a subdivision step 155. This enables the user during the further procedure to move the optical elements 130 to 132 of the projection objective lens system 106 according to the subdivision determined in the determination step 154.

The procedure is therefore adopted again in the movement step 143. As a result the procedural steps 143 to 147, 150 are performed again as described above, whereby in the movement step 143 the movement of the part of the projection objective lens system 106 to be moved takes place according to the subdivision predetermined in the determination step 154 and converted in the subdivision step 155.

The calculation of the target position of the projection objective lens system 106 (calculation step 147) is in the second repetition of the procedure no longer aimed only at the determination of a target angle of rotation, but at determining the two target angles of rotation since in this second repetition a total of three parts moved relative to one another already exists within the projection objective lens system 106, whose positions are uniquely defined by two angles of rotation.

In principle it is possible in an alternative variant of the optimization process to omit the comparison step 150 and to carry out, after each analysis in the analysis step 146 and subsequent calculation of the target position in the calculation step 147, a real rotation of the projection objective lens system 106 to the last calculated target position and to measure the overall image defect present in this position configuration. Such a procedure is however as a rule more complicated than the variant described above, in which a movement of the projection objective lens system to the target position takes place only if the calculated overall image defect is less than the preset value.

One possible way of determining the target position according to the calculation step 147 is based on principles of statistical mechanics. This calculation method relies on the observation that a physical multi-particle system in thermal equilibrium assumes a minimum value of the free energy. The search for the global minimum of a merit function (hereinafter abbreviated to MF), which depends on a plurality of parameters, i.e. the angles of rotation of the various possible rotations of the optical elements 130 to 133 movable with respect to one another, is carried out in a similar manner to the search for the global minimum of the free energy of a multi-particle system. Examples of further possible calculation methods are known genetic algorithms and evolution strategies. These calculation methods are known to the person skilled in the art and are described for example in the following publications: Press, Teukolsky, Vetterling, Flannery, "Numerical Recipes in C—The art of scientific computing", second edition, Cambridge University Press, 1992; E. L. Lawler et al. (Eds.), "The traveling salesman problem. A guided tour of combinatorial optimization", Wiley, Chichester 1985; M Jünger, G. Reinelt, G. Rinaldini, "The traveling salesman problem" in "Annotated bibliographies in conbinatorial optimization", Mauro Dell'Amico (Eds.), Wiley, Chichester, 199, 1997; D. Applegate et al., "On the solution of traveling salesman problems" in Documenta Mathematica, Extra Volume, Proceedings of the ICM 98, 645, 1998; R. E. Burkard, "Well solvable special cases of the traveling salesman problem: A survey" in SIAM Review, Vol. 40, 496, 1998; Tagungs-berichte [Conference Report] in "The Seventh International Conference on Genetic Algorithms", Jul. 19-23, 1997, Michigan State University, East Lansing, Mich.

The determination of the target position is carried out by presetting in an imaginary way specific position configurations of the projection objective lens system, i.e. without in fact actually achieving these position configurations, and then evaluating the merit function associated in each case with these position configurations. As explained above, this evaluation is possible since the individual contributions of the optical elements of the projection objective lens system imaginarily rotated relative to one another are known. Depending on the calculation it is decided whether to accept a new position configuration, achieved by imaginary rotation of at least one optical element by at least a preset angle of rotation, as a new, better position configuration with which to continue the calculation, or whether to continue the calculation with the old position configuration.

The method for calculating a target position of the moved part or parts of the projection objective lens system 106 enables a target position to be rapidly found without having to try all possible position variants of the moved part or parts. The calculation procedure may be designed so as to ensure that an already reached minimum of the overall image defect is disregarded and that adjacent minima, i.e. position regions in which the overall image defect is reduced but is still however remote from a global minimum, can also be disregarded.

As an alternative to the statistical calculation procedure discussed above, it is of course possible for the determination of a target position to investigate specifically by using a computer all possible position configurations that the projection objective lens system 106 can adopt, in order thereby to determine the optimal position configuration of the moved part or parts of the said projection objective lens system 106. Such a predetermination of all possible position combinations of the moved part or parts of the projection objective lens system 106 is suitable if the number of the moved part or parts is still small.

FIG. 3 shows one possible sequence of subdivisions of the projection objective lens system 106 according to the method of FIG. 4. In FIG. 3a the optical elements 130 to 133 of the projection objective lens system 106 are in the initial position. In this case all the circumferential markings 10' to 10'''' coincide.

In the initialization step 140 the projection objective lens system 106 is subdivided into a first part to be moved, namely the optical element 130, and into a second, stationary part, namely the optical elements 131 to 133. For the optical element 130 the calculated target position, which is shown in FIG. 3b, is then found by carrying out the procedural steps 141 to 147 of FIG. 4. The circumferential marking 10' of the optical element 130 is in this connection shifted a bit further to the right in FIG. 3b.

This target position is not actually reached. Instead, within the scope of the method according to FIG. 4 only the comparison steps 150 and optionally 151 are carried out. Within the scope of the description of FIG. 3 it is assumed that, in these comparison steps relating to FIGS. 3a to 3c, it was found that the overall image defect in the target position is greater than the preset value.

In the subsequent subdivision step 155 that is therefore necessary, the still subdivisible part of the projection objective lens system 106, namely the optical elements 131 to 133 that have not yet been moved relative to one another, is in turn subdivided into a first part to be moved, namely the optical element 131, and into a second, stationary part, namely the optical elements 132, 133.

After carrying out the procedural steps 143 to 147 a new calculated target position is obtained for the optical elements of the projection objective lens system 106, which is illustrated in FIG. 3c. Here the optical elements 130 and 131 have been rotated from the initial position shown in FIG. 3a. The optical element 130 adopts in the new target position (c.f. FIG. 3c) a position that is different to the initial position (c.f FIG. 3a) and to the position configuration in which the optical element 130 alone was optimized for the rotation (c.f. FIG. 3b). This is on account of the newly introduced degree of freedom in FIG. 3c, namely the rotatability of the optical element 131.

Following on the subdivision step 155 carried out for the second time, the subdivisible part of the projection objective lens system 106 that still remains, namely the optical elements 132 and 133 (c.f. FIG. 3c), is subdivided into a first part to be moved, namely the optical element 132, and into a second, stationary part, namely the optical element 133. The procedural steps 143 to 147 are then carried out once more. A calculated target position is obtained, which is illustrated in FIG. 3d. Similarly to what was said in connection with FIG. 3c, it is true in this case also that the positions of the optical elements 130, 131 do not have to coincide with their previous positions (c f. FIG. 3c). This may however occur accidentally, as shown in FIG. 3.

Three optical elements 130, 131, 132 rotatable independently of one another are involved in the calculation of the target position of FIG. 3d. If each of these optical elements 130 to 132 can be adjusted with a position step width of 1°, there are 360 possible positions for each of the optical elements 130 to 132; a total of $360^4$, i.e. more than $1.6 \times 10^{10}$ possible position combinations exist for the projection objective lens system 106. This shows that already with four optical elements movable with respect to one another and a position step width of 1°, it is no longer physically or computationally possible to control all possible position combinations in order to find the global optimum. In this case one of the statistical methods discussed above leads much more quickly to a target position in which, within the scope of the positions that are possible due to the permitted degrees of freedom of movement, the overall image defect is reduced to a value in the vicinity of the optimum value.

In the method according to FIG. 4 the projection objective lens system 106 is subdivided into one or more parts to be moved and into a stationary part until the overall image defect falls below a preset value. Alternatively it is also possible in each case, i.e. without comparison with a preset value of an overall image defect, to carry out all possible subdivisions of the projection objective lens system 106. In this case the comparison step 150 is skipped. The procedure then ends when a complete subdivision of the projection objective lens system 106 into all optical elements 130 to 133 has been carried out and the target position (control step 148) has been reached for this complete subdivision. In this target position the smallest value of the overall image defect for the given system is then reached.

Figure 5:
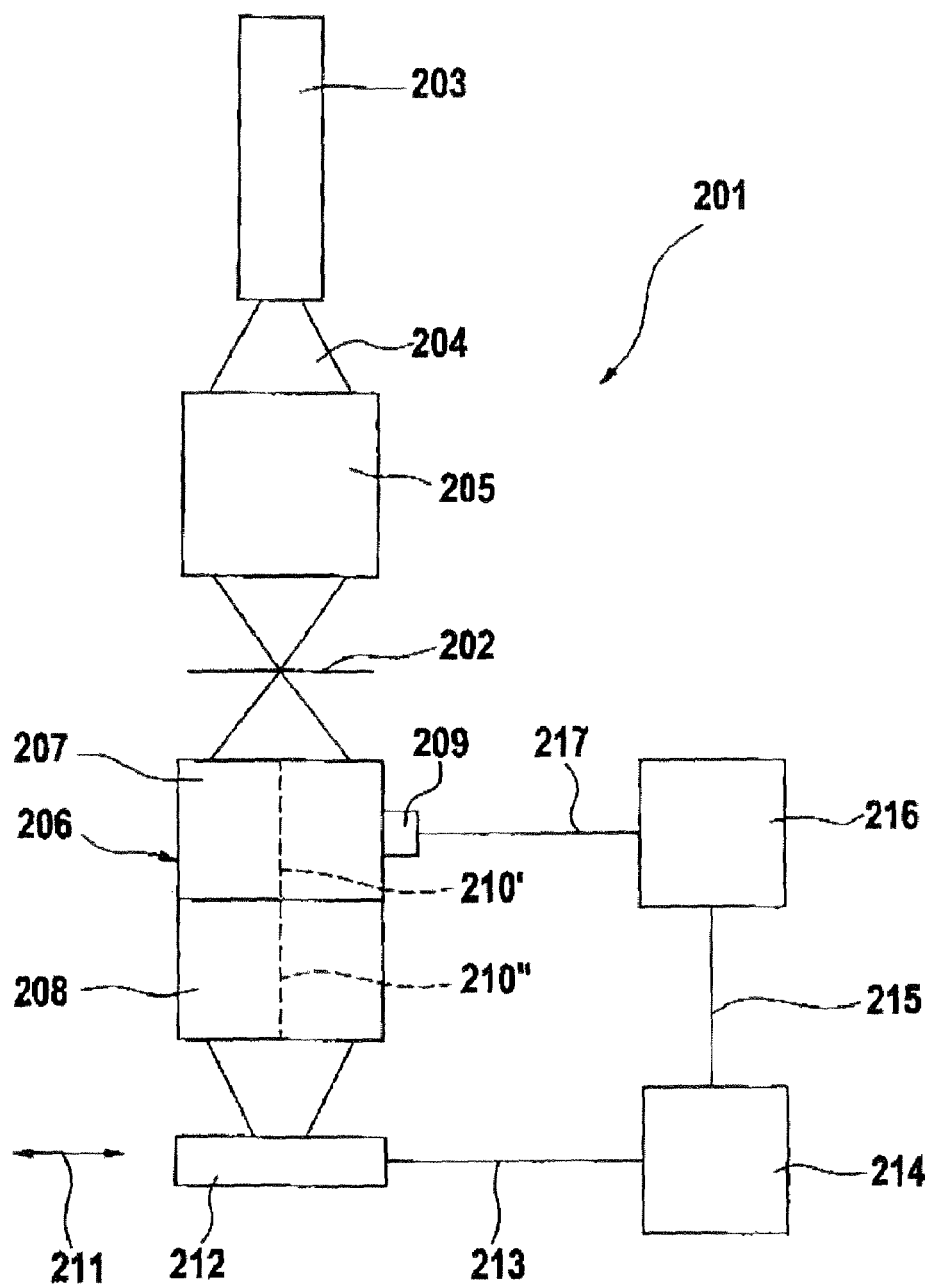
FIG. 5 shows an alternative projection illumination system.

In an alternative embodiment of the projection illumination system illustrated in FIG. 5, which is identified by the reference numeral 201, the rotation of the optical element 207 is performed by a drive 209, for example by an electric motor.

The computer 214 evaluating the overall image defect of the projection objective lens system 206 is in this embodiment connected via a signal line 215 to a control device 216 that controls the drive 209 via a control line 217. In this embodiment the drive 209, the air image measuring device 212, the computer 214 and the control device 216 together form an optimization device for optimizing the imaging properties of the projection objective lens system 206.

The method according to FIG. 2 can be used correspondingly in the projection objective lens system 201. In the following movement step 26, instead of a manual rotation the drive device 209 is controlled via the control device 216 so that the optical element 207 is rotated by the target angle of rotation αZ relative to the optical element 208

Figure 6:
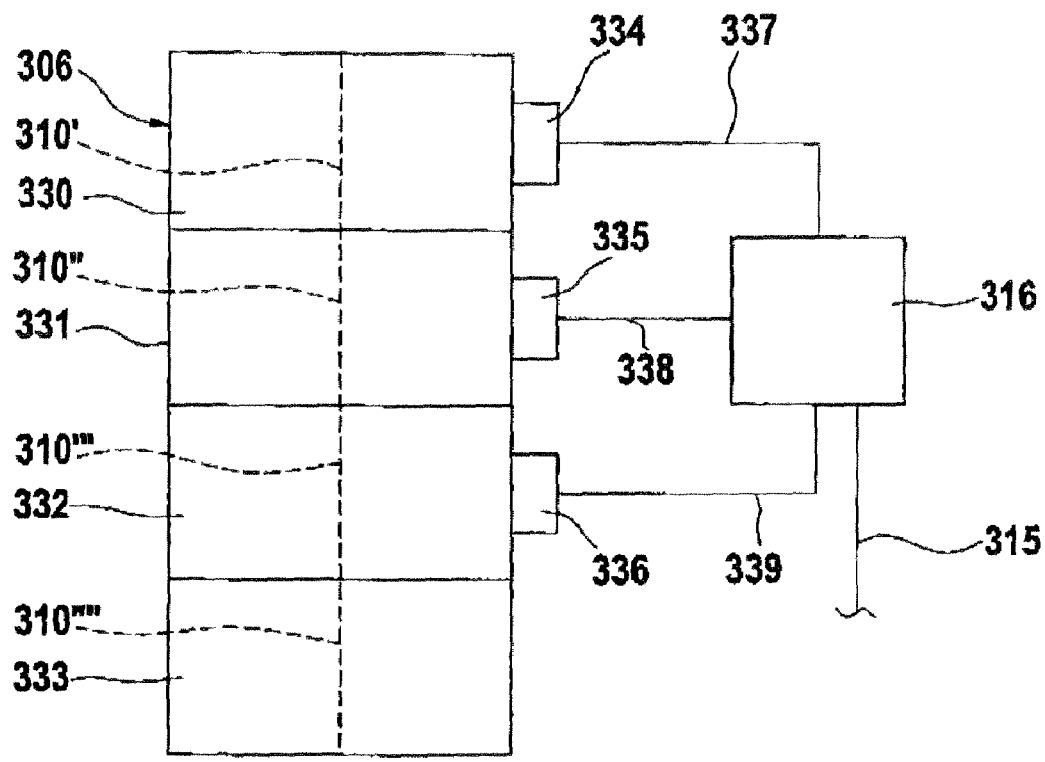
FIG. 6 is a diagrammatic side view of an alternative projection objective lens system that can be optimized according to the invention.

In a further variant of a projection objective lens system illustrated in FIG. 6, which is identified overall by the reference numeral 306, the uppermost three optical elements 330 to 332 in FIG. 6 can be rotated by means of drive devices 334, 335 and 336 about the optical axis of the projection objective lens system 306. For this, the drive devices 334 to 336 are connected via control lines 337, 338 and 339 to a control device 316. The control device 316 is connected via a signal line 315 to a computer, not shown in FIG. 6 (c.f. in this connection the optimization device according to FIG. 5).

Figure 7:
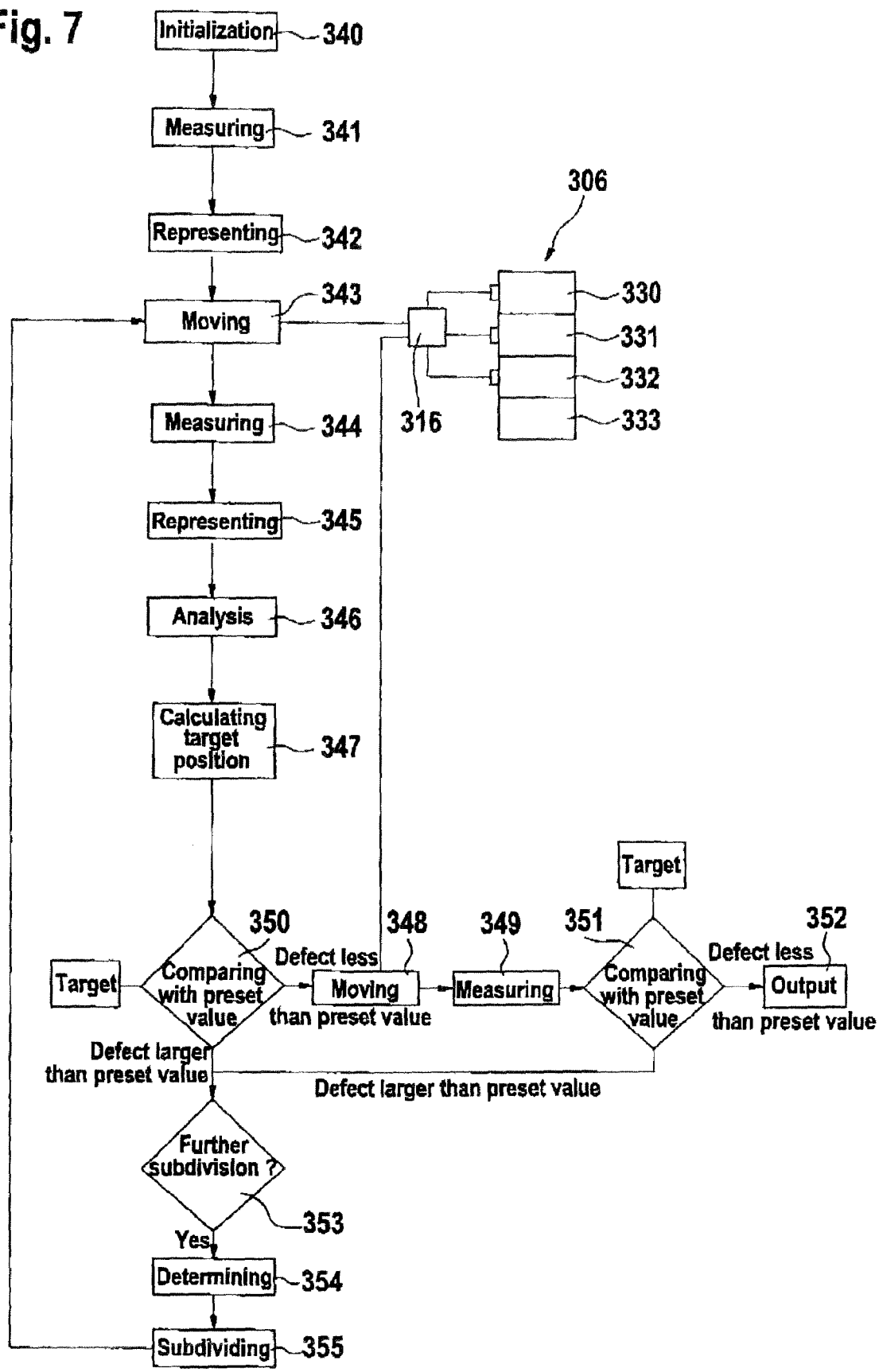
FIG. 7 is an alternative flow diagram for optimizing the projection objective lens system of FIG. 6.

The optimization procedure according to FIG. 4 can be used correspondingly in the projection objective lens system according to FIG. 6. This corresponding procedure is illustrated in FIG. 7 and is described hereinafter only insofar as it differs from the method according to FIG. 7. The subdivision determined in the initialization step 340 in the method according to FIG. 7 is for this purpose converted into a data signal that permits the control device 316 in the further procedure to move the optical elements 330 to 332 of the projection objective lens system 306 in the movement step 343, according to the subdivision determined in the initialization step 340.

In the movement step 348, instead of a manual rotation a corresponding control of the control device 316 is performed so that the moved part of the projection objective lens system 306 is brought into the target position.

The comparison step 353 may take place in the projection illumination system with the projection objective lens system 306 by reading out corresponding movement data that were stored in the control device 316 and that reproduce the movement history. The subdivision determined in the determination step 354 is correspondingly converted into a data signal that permits the control device 316 in the further procedure to move the optical elements 330 to 332 of the projection objective lens system 306 in the movement step 343, according to the subdivision determined in the subdivision step 354.

The measurement of the overall image defect required for the various variants of the optimization method was performed hereinbefore with the aid of an air image measurement, i.e. a position-resolved intensity measurement in the region of the plane of the image or a plane of the projection objective lens system conjugate thereto.

A measurement of the overall image defect may alternatively be performed by a known interferometric method, which provides measurement information that in the ideal case allows an exact reconstruction of the wave front.

Ambiguities may occur in air image data that prevent an unambiguous allocation of individual contributions effected by the factorization in terms of Zernike functions, to the overall image defect, since the radial orders of this factorization cannot be specified unambiguously. For example, a factorization of a "coma" type image defect in terms of Zernike functions includes radial contributions of the Zernike functions Z7 and Z14, in which connection with an air image measurement it cannot as a rule be decided whether a measured radial dependence of the overall image defect was caused by the contribution of the Zernike function Z7 or by the contribution of the Zernike function Z14.

Instead of obtaining wave front data by means of interferometry, sufficient wave front information for the description of the radial pattern of the overall image defect can also be obtained from air image measurements at various illumination geometries, i.e. so-called illumination settings. This is possible with a projection illumination system that is modified only slightly compared to those illustrated in FIGS. 1 and 5:

For this purpose an aperture diaphragm with a variable aperture is incorporated in the region of the illumination optics 5, 205 of the projection illumination system 1, 201. The overall image defect is then measured with different forms of the aperture, for example at different diameters of the illumination bundle 4, 204. From these measurements conclusions can be drawn regarding the various radial wave front orders and thus also the various radial orders in the description of the overall image defect, that are sufficiently accurate for the optimization methods described above.

As coefficients b that make up the coefficient spectrum S, there may also be used for this factorization the coefficients b that are obtained directly from the matching of a linear combination of Zernike functions to the image defect data measured with the air image measuring device. However, corresponding to the above discussion these coefficients as a rule consist of a mixture of various radial wave front orders k, which is why direct knowledge of individual radial orders is generally not available. If however such radial wave front orders k are to be individually optimized per se in each case, separate knowledge of these orders is necessary. In this case, instead of the coefficient spectrum S described above, a coefficient spectrum is used that is composed of weighted coefficients $\delta b$, which can be obtained according to the following equation from the coefficients $b_{il}$ that belong to various (1 to L) illumination settings of the illumination optics of the projection illumination system:

$$\delta b_i(k) = \sum_{i=1}^{L} g_l(k) b_{il}. \quad (7)$$

The difference weights $g_l(k)$ are in this connection chosen so that the coefficients $\delta b$ directly reproduce the coefficient spectrum for a radial wave front order k.

Figure 8:
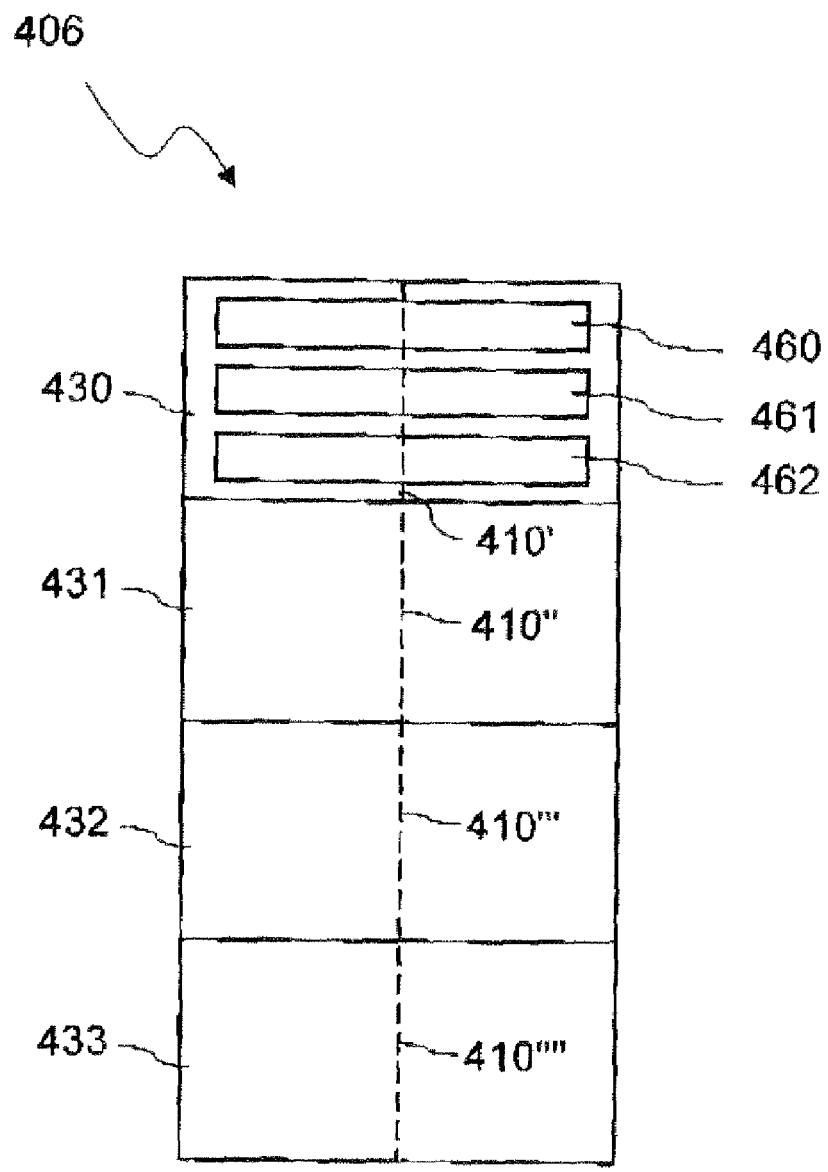
FIG. 8 is a diagrammatic side view of a projection objective according to an embodiment involving a pre-optimization of optical elements.

FIG. 8 shows another embodiment of a projection objective which is denoted in its entirety by 406. The projection objective 406, which is similar to the projection objective 106 shown in FIG. 3, is illustrated in FIG. 8 such that the interior structure of its upper optical element 430 can be seen. The upper optical element 430 comprises three lenses 460, 461, 462 that are arranged one behind the other along the optical axis of the projection objective 406. The lenses 460, 461, 462, which are represented in the side view as rectangles, are mounted in lens mounts (not shown) and are, together with their mounts, rotatable around the optical axis of the projection objective 406. The other optical elements 431, 432, and 433 each comprise a plurality of tenses, too, but these lenses are not shown in FIG. 8 for the sake of simplicity.

The optimizing method illustrated in FIG. 4 is applicable also to the projection objective 406 shown in FIG. 8. For those optical elements that comprise several optical components, for example lenses 460 to 462, an internal pre-optimization is carried out.

The method steps in addition to those shown in FIG. 4 are carried out, according to a first embodiment, after a subdivision of the projection objective 406 in optical elements 430 to 433 has been established. The pre-optimization is then carried out for all optical elements 430 to 433.

Figure 9:
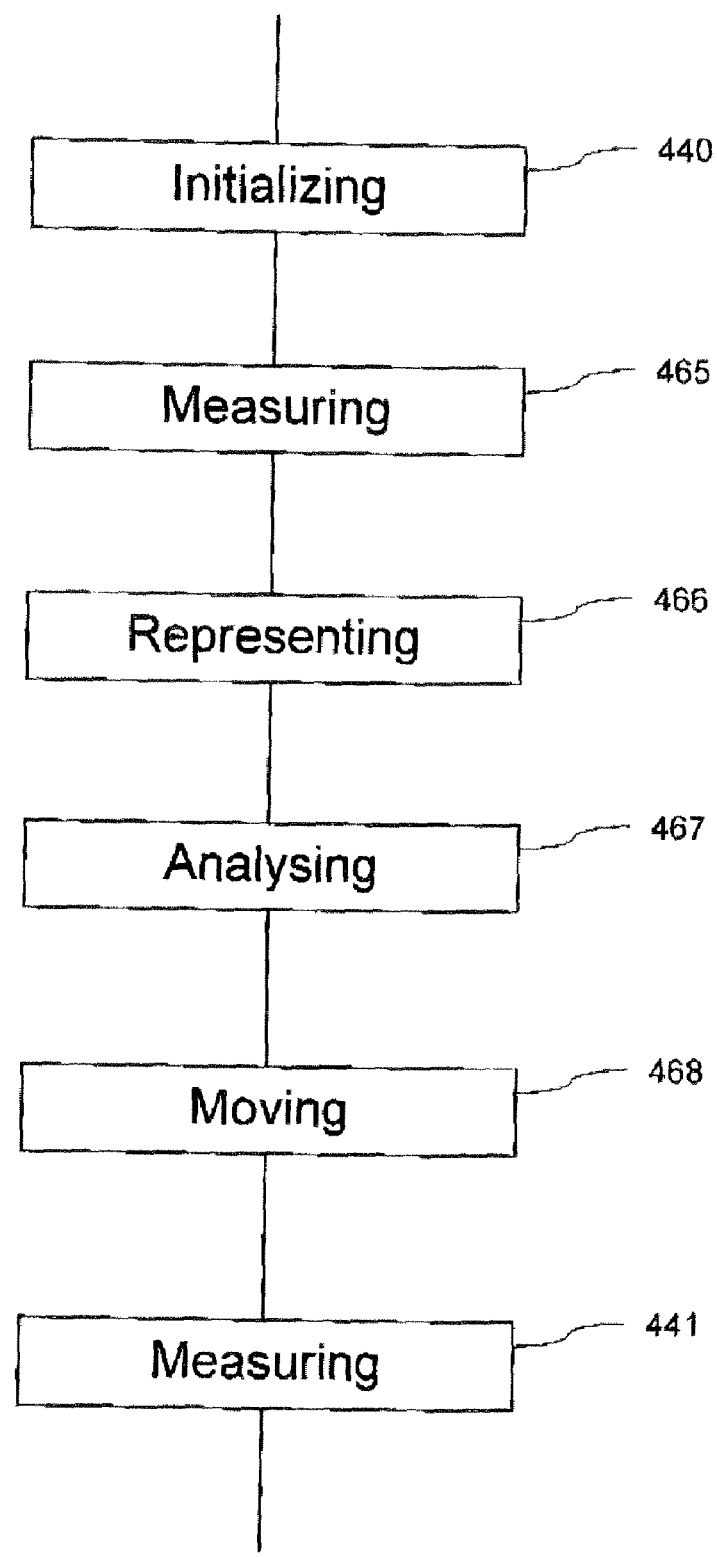
FIG. 9 is a flow diagram illustrating additional steps for optimizing the projection objective shown in FIG. 8.

A second embodiment for such a pre-optimization will be further described in more detail with reference to the flow diagram shown in FIG. 9:

According to this second embodiment, the additional method steps are introduced between an initializing step 440 and the measuring step 441. In the initializing step 440 the projection objective 406 is divided into a movable part suitable for the later measurement step 441 and a stationary part, as has been explained further above. The steps to be carried out in the pre-optimization procedure between the initializing step 440 and the measurement step 441 are, at least in principle, identical for both embodiments and are for that reason described hereinafter for both embodiments.

Referring to FIG. 8, the projection objective 406 may be divided in the initializing step 440 into a first part, which can be moved in its entirety and consists of the optical element 430, and a second stationary part comprising the optical elements 431, 432, 433.

After the initializing step 440 the lenses 460 to 462 of optical element 430 are individually measured with respect to their imaging properties before they are assembled into the objective. Measurement and test methods for individually determining imaging properties of single optical components, and also the representation of the measured imaging defects as a linear combination of base functions of an orthogonal function set, are known in the art as such. The measurement of the imaging properties of the lenses 460 to 462 may, in particular, be carried out using interferometric methods. Within the computing step 466 a representation of the overall image defect resulting from the individually measured image defects of the lenses 460 to 462 is obtained as a linear combination of the base functions of the orthogonal function set.

In an analyzing step 467 the representation obtained in the computing step 466 is used for determining targets positions for the lenses 460 to 462 within the optical element 430. For each of the lenses 460 to 462 a number (for example 16) of distinct rotational positions may be assumed in the analyzing step 467.

In a moving step 468 the lenses 460 to 462 are rotated relative to each other around the optical axis of the projection objective 406 until they reach their individual target positions determined in the analyzing step 467. In the target positions the overall image defect of the optical element 430 fulfills an optimizing criterion which has been determined in the analyzing step 467.

Preferably those coefficients of the linear combination representing the overall image defect of the optical element 430 are optimized that relate to higher azimutal orders. An image defect relates to a higher azimutal order if it has in the azimutal direction, i.e. along the circumference around the optical axis of the projection objective 406, an n-fold symmetry with n being larger than two.

For optimizing these higher azimutal orders an optimization criterion in the form of a merit function may be used. In this merit function the coefficients of the base functions of the orthogonal function set relating to higher azimutal orders of the overall image defect are weighted higher than those coefficients that correspond to image defects of a lower azimutal order.

In the simplest case the optimizing of higher azimutal orders in the analyzing step 476 may be carried out by suppressing the coefficients of lower azimutal order in the analyzing step 467.

In the second embodiment of the pre-optimization method, a measurement step 441 follows which corresponds to the measurement step 141 (cf. FIG. 4 and the corresponding description) and the step 341 (cf. FIG. 7 and the corresponding description).

In the measurement step 441 it is possible to check whether new image defects have been caused by the movement of the lenses 460 to 462 in the movement step 468. Such defects may be caused by internal stress induced during the assembly of the optical element 430. Often such internal stress results in image defects of low azimutal order, i.e. having an n-fold rotational symmetry with n equal to 1 or 2. Such contributions to the image defect can be effectively reduced with the optimizing method which is carried out after the measurement step 441 (cf. FIGS. 4 and 7 with the corresponding description).

Both alternative embodiments of the pre-optimizing method differ principally in the following respect:

In the first embodiment, the pre-optimization is carried out for all optical elements by independently determining a target position for the optical component within each optical element. This pre-optimization is independent from a subsequent subdivision into a stationary part and a moving part that may each comprise one or more optical elements.

In the second embodiment, the pre-optimization is carried out dependent on the subdivision into the stationary part and the moving part by determining target positions for the optical components within the stationary part and by determining target positions for the optical components within the moving part. According to the first embodiment, the pre-optimization has to be carried out only once. According to the second embodiment, the pre-optimization has to be carried out after each subdividing step.

In the embodiment shown in FIG. 8 all lenses 460 to 462 of the optical element 430 have been measured for carrying out the pre-optimization process. However, for various reasons it may be sufficient to restrict the pre-optimization process to a sub-group of lenses, for example to the lenses 460 and 461. Then only image defects caused by these two lenses 460, 461 are measured, and consequently target positions are calculated only for these two lenses 460, 461. Such a case may occur, for example, if the lens 462 has to be kept fixed, because it is intrinsically birefringent and a compensation of birefringence is achieved only if a certain azimutal relationship with other birefringent lenses is maintained.

Figure 10:
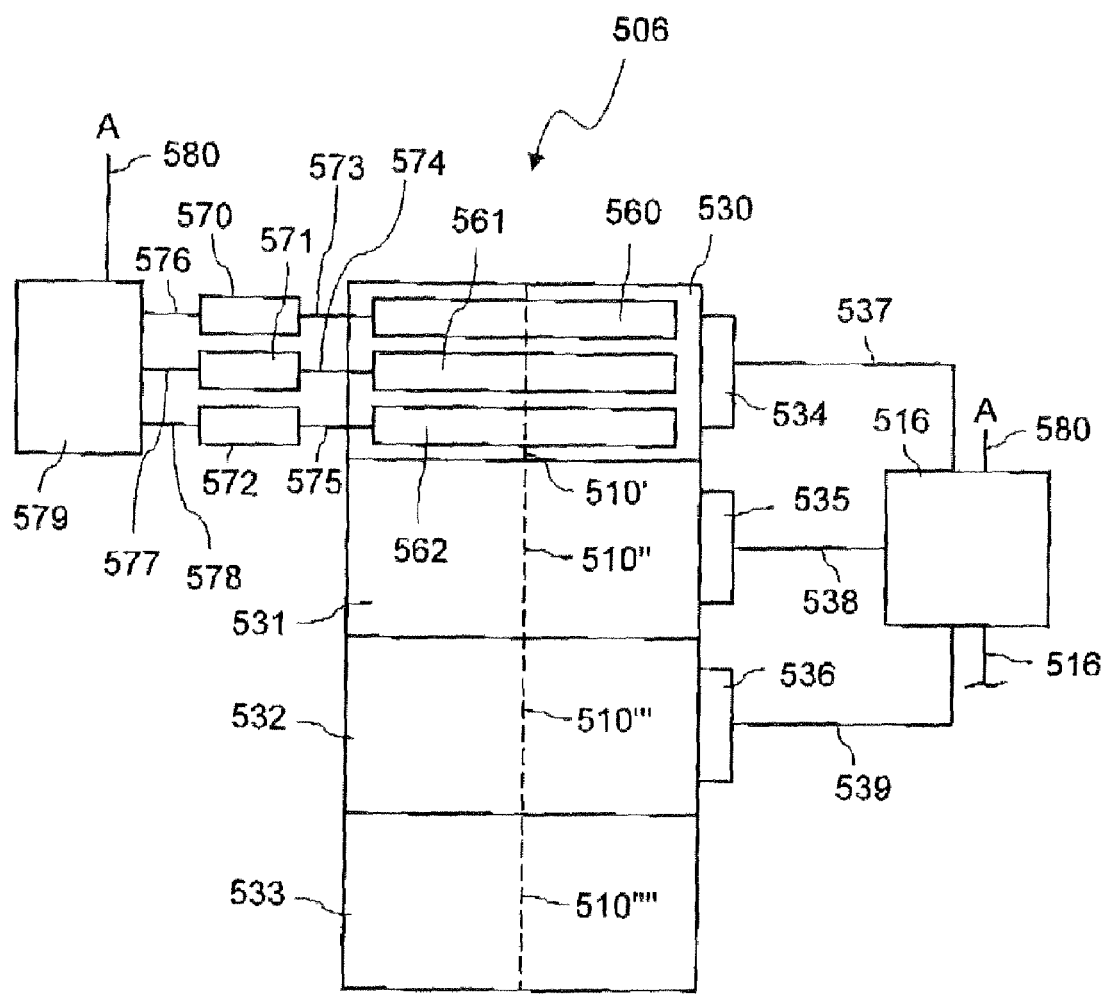
FIG. 10 is a projection objective according to another embodiment in a representation similar to FIG. 8.

FIG. 10 shows a further embodiment of a projection objective 506 in a representation similar to FIG. 8. In the projection objective 506, the optical elements 530, 531, 532 are, similar to what has been described with reference to FIG. 6, independently rotatable around the optical axis of the projection objective 506. For rotating the optical elements 530, 531, 532 first drive devices 534, 535 and 536, respectively, are provided.

Additionally the lenses 560, 561, 562 of the optical element 530 are independently rotatable around the optical axis of the projection objective 506 with the help of second drive devices 570, 571, 572. The second drive devices 570, 571, 572 are connected to the lenses 560, 561, 562 via drive lines 573, 574 and 575, respectively, and via data lines 576, 577, 578 to a first control device 579. The latter is connected via a further data line 580 (connection A-A) to a control device 516, whose structure and function corresponds to the control device 316 shown in FIG. 6.

The upper optical element 530 of the projection objective 506 is pre-optimized in accordance with the method described with reference to FIG. 9. To this end all optical components of the projection objective 506 are first individually measured with respect to their image defects in a measurement step 465. As described above, the overall image defect of the optical element 530 is represented as a linear combination of the base functions of the orthogonal function set. In the moving step 468 the drive devices 570 to 572 move the optical components of the optical element 530 to their target positions, which have been obtained in the analyzing step 467. The drive devices 570 to 572 receive suitable control data from the first control device 579 that is connected to the computer which carries out the analyzing step 467 (cf. the optimizing device shown in FIG. 5). Finally the optimizing method is continued with the step 341 (cf. FIG. 7).

Figure 11:
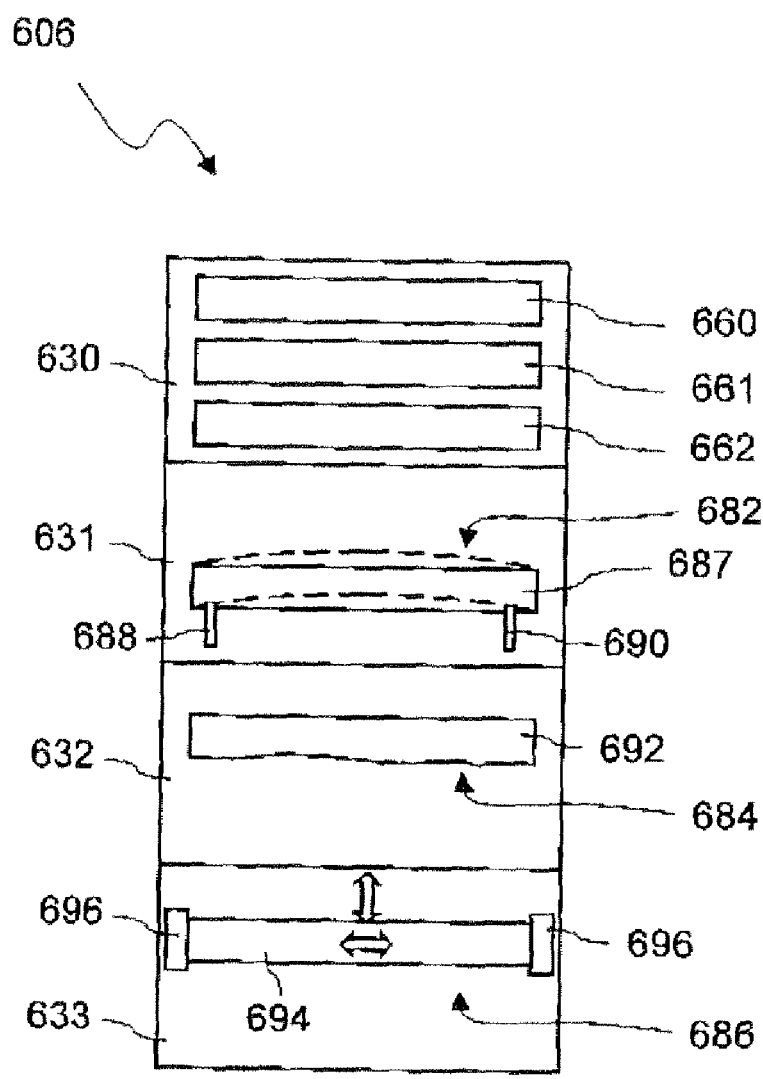
FIG. 11 is a projection objective comprising a correcting optical element according to a still further embodiment in a representation similar to FIG. 8.

FIG. 11 shows another embodiment of a projection objective denoted in its entirety by 606 in a representation similar to FIG. 8. The projection objective 606 comprises a first correcting optical element 682, a second correcting optical element 684 and a third correcting optical element 686. The correcting optical elements 682, 684, 686 are arranged at suitable positions within the projection objective 606 such that they can effectively correct image defects. In the embodiment shown, each correcting optical element 682, 684, 686 is arranged in a different optical element 631, 632, 633. However, other positions of the correcting optical elements 682, 684, 686 are contemplated as well. Further, there may be only one or two correcting optical element, or there may be more than three similar or different correcting optical elements arranged in the projection objective 606.

Each correcting optical element 682, 684, 686 has at least two different configurations. The first correcting optical element 682 comprises, in the embodiment shown, a curved lens 687 and actuators 688, 690. The actuators 688, 690 are configured such that they may exert bending forces on the lens 687 such that the lens 687 deforms, as is indicated by broken lines in FIG. 11. Depending on the number and position of the actuators 688, 690, the lens 687 may be subjected to a deformation having an n-fold symmetry with n=2, 3, 4, . . . . However, it is also possible to bend the lens 687 in a completely asymmetrical fashion. Each different shape of the lens 687 is considered, in the context of the present embodiment, as a different configuration of the first correcting optical element 682.

The second correcting optical element 684 is formed by a plate 692 having parallel surfaces. One or both surfaces are provided with minute local aspherical deformations that may be manufactured by locally removing optical material. Typically, the deformations are in the range of 1 nm to about 100 nm. For that reason such deformations are often referred to as "nanoaspheres". These aspherical local deformations can be designed such that very small and almost arbitrary wavefront deformations may be effectively corrected for. Such correcting optical elements are known as such in the art and will not be described in further detail.

Since the local surface deformations of the plate 692 cannot be changed once they have been manufactured, the second correcting optical element 684 is not adjustable as is the case with the first correcting optical element 682 comprising a deformable lens 687. However, different plates 692 having distinct surface deformations are considered, in the context of the present embodiment, as different configurations of the second correcting optical element 684

The third correcting optical element 686 comprises a curved lens 694 and an actuator 696. The actuator 696 is configured such that it may exert forces on the lens 694 that result in movements of the lens 694 along the optical axis and/or in a direction perpendicular thereto. Different configurations of the third correcting optical element 686 correspond to different positions of the lens 694 along the optical axis or perpendicular thereto.

The optimization method that has been described further above with reference to FIG. 2 is, according to the present embodiment, amended in the following way:

The optical effects of the different configurations of the correcting optical elements 682, 684, 686 are each represented as linear combinations of base functions of an orthogonal function set. This makes it possible to take into account the different possible configurations of the correcting optical elements 682, 684, 686 when calculating a target position according to step 25 (cf. FIG. 2). Within the optimization process, there are therefore not only degrees of freedom provided by the movable optical elements of the projection objective 606, but in addition the different configurations of the correcting optical elements 682, 684, 686.

Incorporating the different configurations of the correcting optical elements 682, 684, 686 into the optimization process does not, at least in general, lead to the same result as would be obtained if the optimization process would be restricted to the positions of the optical elements 630 to 633, and residual image defects would be corrected thereafter by selecting a suitable configuration of the correcting optical elements 682, 684, 686. For example, if it is discovered in the analyzing step 24 that there are two prominent image defects present in the projection objective 606, and only one of these, but not both can be corrected simultaneously by an appropriate target position of the optical elements 630 to 633, the choice which image defect will be corrected may depend on the potential of one or all correcting optical element 682, 684, 686 to correct the remaining image defect.

The correcting optical elements 682, 684, 686 may be arranged in one or more stationery optical elements so that their azimutal position is not affected by the movement of the movable optical elements into the target position calculated in step 25. However, some or all correcting optical elements 682, 684, 686 may be arranged in movable optical elements. In this case the movements of the correcting optical elements have to be taken into account in the analyzing step 24, or the respective correcting optical elements 682, 684, 686 are mounted within the moving optical elements such that their azimutal position is allowed to remain stationary while the remaining components of the respective optical element are moved into the calculated target position.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. An optical system, comprising
   a) at least two digital optical elements whose spatial relation with respect to each other is configurable to be changed, wherein at least one of the optical elements comprise a plurality of optical components,
   b) first measuring means for individually measuring an image defect of each optical component,
   c) first computing means for computing first target positions for the plurality of optical components such that an overall image defect of the at least one of the optical elements is below a predetermined threshold value,
   d) second measuring means for measuring an overall image defect of the optical system,
   e) second computing means for representing the measured overall image defect as a linear combination of base functions of an orthogonal function set and for calculating second target position for the at least two optical elements so as to reduce the overall image defect.

2. The optical system of claim 1, wherein the overall image defect is minimized if the at least two optical elements are arranged in the second target positions.

3. The optical system of claim 1, comprising the step of moving the optical components into the first target positions.

4. The optical system of claim 1, comprising the step of assembling the at least one optical element such that the optical components are positioned at the first target positions.

5. The optical system of claim 1, wherein the measuring means are configured to direct measuring light through the optical system such that the at least two optical elements are subjected to the measuring light.

6. The optical system of claim 1, wherein the first computing means are configured to represent the overall image defect of the at least one of the optical elements as a linear combination of base functions of an orthogonal function set.

7. The optical system of claim 1, wherein the first computing means are configured to decompose the overall image defect of the at least one of the optical elements into azimutal orders in such a way that higher azimutal orders larger than n, n=2, 3, 4, . . . , are weighted higher than lower azimutal orders equal or less than n.

8. The optical system of claim 7, wherein the first computing means are configured to suppress azimutal orders equal or less than n.

9. The optical system of claim 7 or 8, wherein n=2.

10. The optical system of claim 1, wherein the first measuring means are configured for individually measuring an image defect of optical components that are received in mounts.

11. The optical system of claim 1, wherein the first measuring means comprise an interferometer.

12. The optical system of claim 1, comprising first driving means for rotating the components about an optical axis of the optical system.

13. The optical system of claim 1, comprising second driving means for changing the position of at least one optical element.

14. The optical system of claim 13, wherein the second driving means are configured to rotate the at least one optical element about an optical axis of the optical system.

15. The optical system of claim 1, wherein the second measuring means comprises an air image detector for measuring the overall image defect.

16. The optical system of claim 1, wherein the orthogonal functions are Zernike functions.

17. A method for improving imaging properties of an optical system comprising at least two optical elements whose spatial relation with respect to each other is configurable be changed, wherein at least one of the optical elements comprise a plurality of optical components, said method comprising the following steps:
   a) individually measuring an image defect of each optical component,
   b) computing first target positions for the plurality of optical components such than an overall image defect of the at least one of the optical elements is below a predetermined threshold value;
   c) measuring an overall image defect of the optical system, wherein the at least two optical elements are subjected to the measuring light;
   d) representing the measured overall image defect as a linear combination of base functions of an orthogonal function set;
   e) changing the spatial relation of the at least two optical elements;
   f) repeating steps c) and d), thereby obtaining a new linear combination of the base functions of an orthogonal function set;
   g) calculating second target positions for the at least two optical elements so as to reduce the overall image defect;
   h) moving the at least two optical elements to the second target positions.

18. A method for improving imaging properties of an optical system comprising at least two optical elements whose spatial relation with respect to each other is configurable to be changed, wherein at least one of the optical elements comprise a plurality of optical components, said method comprising the following steps:

a) individually measuring a deviation from a design specification of at least one optical component whose manufacture has not been finished, b) computing a first target position for the at least one optical component such that an image defect caused by the deviation measured in step a) is below a predetermined threshold value;

c) finishing the manufacture of the at least one optical component;

d) assembling the at least one optical element with the at least one optical component being in the first target position;

e) measuring an overall image defect of the optical system, wherein the at least two optical elements are subjected to the measuring light;

f) representing the measured overall image defect as a linear combination of base functions of an orthogonal function set;

g) changing the spatial relation of the at least two optical elements;

h) repeating steps e) and f), thereby obtaining a new linear combination of the base functions of an orthogonal function set;

i) calculating second target positions for the at least two optical elements so as to reduce the overall image defect;

j) moving the at least two optical elements to the second target positions.

19. The method of claim 18, wherein the design specification relates to the homogeneity of the refractive index.

20. The method of claim 18, wherein the design specification relates to the homogeneity of the birefringence tensor.

21. The method of claim 18, wherein the at least one optical component whose manufacture has not been finished is a lens blank.

22. The method of claim 21, wherein the step c) comprises the further steps of grinding and coating the lens blank.

23. The method of claim 18, wherein steps a) and d) are carried out for all optical components of the at least one optical element.

24. The method of claim 18, comprising the additional step of discarding the at least one unfinished optical component if the image defect caused by the deviation is above a predetermined threshold value.

25. The method of claim 18, wherein the image defect caused by the deviation is minimal in the first target position.

26. An optical system, comprising:

a) at least two optical elements whose spatial relation with respect to each other is configurable to be changed, b) measuring means for measuring an overall image defect of the optical system, said measuring means being configured to direct measuring light through the optical system such that the at least two optical elements are subjected to the measuring light, c) a correcting optical element for correcting an image defect, wherein the correcting optical element has at least two distinct configurations, d) computing means for representing the optical effort of the correcting optical element in the at least two distinct configurations as linear combination of base functions of an orthogonal function set, representing the measured overall image defect as a linear combination of base functions of an orthogonal function set and, calculating a target position for the at least two optical elements and a configuration of the correcting optical element so as to reduce the overall image defects.

27. The optical system of claim 26, wherein the correcting optical element comprises a deformable optical component and an actuator for deforming the component.

28. The optical system of claim 26, wherein the correcting optical element comprises a tiltable optical component and an actuator for tilting the component relative to an optical axis of the optical system.

29. The optical system of claim 26, wherein the correcting optical element comprises a shiftable optical component and an actuator for shifting the component perpendicular to or along an optical axis of the optical system.

30. The optical system of claim 26, wherein the correcting optical element comprises an optical component having an optical surface that is adapted to be locally deformed in at least two different non-rotationally symmetrical configurations.

31. The optical system of claim 26, comprising means for measuring the optical effect of the correcting optical element in the at least two distinct configurations.

32. The optical system of claim 26, comprising means for simulating the optical effect of the correcting optical element in the at least two distinct configurations.

33. A method for improving imaging properties of an optical system comprising at least two optical elements and a correcting optical element having at least two distinct configurations, the method comprising the following steps:

a) measuring an overall image defect of the optical system, wherein the at least two optical elements are subjected to measuring light;

b) representing the measured overall image defect as a linear combination of base functions of an orthogonal function set;

c) changing the spatial relation of the at least two optical elements;

d) repeating steps a) and b), thereby obtaining a new linear combination of the base functions of an orthogonal function set;

e) representing the optical effect of the correcting optical element in the at least two distinct configurations as linear combinations of base functions of an orthogonal function set;

f) calculating, in a single optimization process, a target position for the at least two optical elements and a configuration of the correcting optical element so as to reduce the overall image defect;

g) moving the at least two optical elements into the target position.

34. The method of claim 33, wherein the correcting optical element is deformed in step g).

35. The method of claim 33, wherein the correcting optical element is tilted in step g).

36. The method of claim 33, wherein the correcting optical element is shifted perpendicular to or along an optical axis of the optical system.

37. The method of claim 33, wherein an optical surface of the correcting optical is locally deformed in step g) such that it receives a non-rotationally symmetrical shape.

38. The method of claim 37, wherein the optical surface is deformed by locally removing or adding material.

39. The method of claim 33, wherein the optical effect of the correcting optical element in the at least two distinct configurations is measured.

40. The method of claim 33, wherein the optical effect of the correcting optical element is the at least two distinct configurations is simulated.

41. The method of claim 33, comprising the additional step of bringing the optical element into the configuration calculated in step f).

* * * * *